US010096527B2

(12) United States Patent
LaRose et al.

(10) Patent No.: US 10,096,527 B2
(45) Date of Patent: Oct. 9, 2018

(54) HYBRID CORRECTIVE PROCESSING SYSTEM AND METHOD

(71) Applicant: TEL Epion Inc., Billerica, MA (US)

(72) Inventors: Joshua LaRose, Albany, NY (US); Brian D. Pfeifer, Lagrangeville, NY (US); Vincent Lagana-Gizzo, East Greenbush, NY (US); Noel Russell, Waterford, NY (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 15/242,376

(22) Filed: Aug. 19, 2016

(65) Prior Publication Data

US 2017/0053843 A1     Feb. 23, 2017

Related U.S. Application Data

(60) Provisional application No. 62/208,362, filed on Aug. 21, 2015.

(51) Int. Cl.
     *H01L 21/66*      (2006.01)
     *H01J 37/32*      (2006.01)
     (Continued)

(52) U.S. Cl.
     CPC ........ *H01L 22/20* (2013.01); *G05B 19/41875* (2013.01); *H01J 37/32009* (2013.01); *H01J 37/3244* (2013.01); *H01J 37/3299* (2013.01); *H01J 37/32935* (2013.01); *H01L 21/3065* (2013.01); *G05B 2219/32216* (2013.01);
(Continued)

(58) Field of Classification Search
CPC .. H01L 22/20; H01L 21/3065; H01J 37/3299; H01J 37/32935; H01J 37/3244; H01J 37/32009; G05B 19/41875
See application file for complete search history.

(56) References Cited

U.S. PATENT DOCUMENTS 6,550,990 B2    4/2003    Sakurai et al.
9,385,012 B2    7/2016    Fujii et al.
(Continued)

FOREIGN PATENT DOCUMENTS

JP    2002-252167 A    9/2002
JP    2014-158014 A    8/2014

OTHER PUBLICATIONS

International Search Authority, International Search Report issued in counterpart International Patent Application No. PCT/US2016/047911, dated Nov. 18, 2016, 10 pp.

*Primary Examiner* — Duy Vu N Deo
(74) *Attorney, Agent, or Firm* — Wood Herron & Evans LLP

(57) ABSTRACT

A system and method for performing corrective processing of a workpiece is described. The system and method includes receiving a first set of parametric data from a first source that diagnostically relates to at least a first portion of a microelectronic workpiece, and receiving a second set of parametric data from a second source different than the first source that diagnostically relates to at least a second portion of the microelectronic workpiece. Thereafter, a corrective process is generated, and a target region of the microelectronic workpiece is processed by applying the corrective process to the target region using a combination of the first set of parametric data and the second set of parametric data.

20 Claims, 6 Drawing Sheets

(51) Int. Cl.
   *H01L 21/3065*      (2006.01)
   *G05B 19/418*      (2006.01)

(52) U.S. Cl.
   CPC ......... *H01J 2237/334* (2013.01); *H01L 22/12* (2013.01); *Y02P 90/22* (2015.11)

(56) References Cited

U.S. PATENT DOCUMENTS

| | | |
|---|---|---|
| 2003/0049390 A1 | 3/2003 | Shanmugasundram et al. |
| 2006/0031788 A1* | 2/2006 | Bauer ............ H01L 22/20 700/110 |
| 2009/0084759 A1* | 4/2009 | MacCrimmon ..... H01J 37/3023 216/84 |
| 2010/0193472 A1 | 8/2010 | Tabat et al. |
| 2010/0193701 A1 | 8/2010 | Tabat et al. |
| 2010/0214545 A1* | 8/2010 | Funk ............ G03B 27/42 355/53 |

* cited by examiner

HYBRID CORRECTIVE PROCESSING SYSTEM AND METHOD

Pursuant to 37 C.F.R. § 1.78(a)(4), this application claims the benefit of and priority to U.S. Provisional Application No. 62/208,362 filed on Aug. 21, 2015 which is expressly incorporated by reference herein in its entirety.

FIELD OF INVENTION

The field of invention relates generally to the fields of material processing and semiconductor integrated circuit manufacturing and, more specifically but not exclusively, relates to the spatial correction of various workpiece attributes.

BACKGROUND OF THE INVENTION

Description of Related Art

With the advancement of substrate size and feature scale in semiconductor device manufacturing from one technology node to the next, as well as the increasing complexity of devices transitioning from planar to non-planar, the need for advanced precision control of feature attributes across large diameter substrates is rapidly escalating. Current methodologies, including beam processing systems as well as non-beam processing systems, such as spatially controlled plasma and non-plasma processing systems, are contemplated for advanced corrective processing schemes.

As an example, location specific processing by gas cluster ion beam (GCIB) is a highly precise method for correcting across-substrate non-uniformity of feature attributes. Provided spatially resolved feature attribute data, such as feature height or thickness measured at multiple sites on a substrate, a location specific processing scheme can be applied to correct variations in the feature attribute data to within tolerable or acceptable limits. However, these schemes are limited by the data content of the measurement technique or source providing input to the corrective measure. For instance, the amount of measurement coverage available at the peripheral edge of a substrate can be lacking. And, this occurrence is especially true when considering a patterned die pad measurement scheme.

SUMMARY OF THE INVENTION

Embodiments of the invention relate generally to the fields of material processing and semiconductor integrated circuit manufacturing and, more specifically but not exclusively, to the spatial correction of various workpiece attributes. In particular, a hybrid system and method for corrective processing using beam and non-beam systems are described.

According to one embodiment, a method for performing corrective processing of a workpiece is described. The method includes: receiving a first set of parametric data from a first source that diagnostically relates to at least a first portion of a microelectronic workpiece, receiving a second set of parametric data from a second source different than the first source that diagnostically relates to at least a second portion of the microelectronic workpiece, placing the microelectonic workpiece in a corrective processing system; generating a corrective process; and processing a target region of the microelectronic workpiece by applying the corrective process to the target region using a combination of the first set of parametric data and the second set of parametric data.

According to another embodiment, a processing system configured to perform corrective processing on a microelectronic workpiece is described. The system includes a corrective processing system configured to treat a workpiece with a corrective process, and a multi-process controller programmably configured to: receive a first set of parametric data from a first source that diagnostically relates to at least a first portion of a microelectronic workpiece, receive a second set of parametric data from a second source different than the first source that diagnostically relates to at least a second portion of the microelectronic workpiece, generate a corrective process; and process a target region of the microelectronic workpiece by applying the corrective process to the target region using a combination of the first set of parametric data and the second set of parametric data.

DETAILED DESCRIPTION OF SEVERAL EMBODIMENTS

Methods and systems for performing corrective processing of a workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Workpiece" as used herein generically refers to the object being processed in accordance with the invention. The workpiece may include any material portion or structure of a device, particularly a semiconductor or other electronics device, and may, for example, be a base workpiece structure, such as a semiconductor wafer or a layer on or overlying a base workpiece structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of workpieces, but this is for illustrative purposes only and not limitation.

As described in part above, when correcting or adjusting variations of feature attributes across a workpiece, corrective schemes are limited by the data content of the measurement technique or source providing input to the corrective measure. For instance, the amount of measurement coverage available at the peripheral edge of a substrate can be lacking. And, this occurrence is especially true when considering a patterned die pad measurement scheme.

Figure 1:
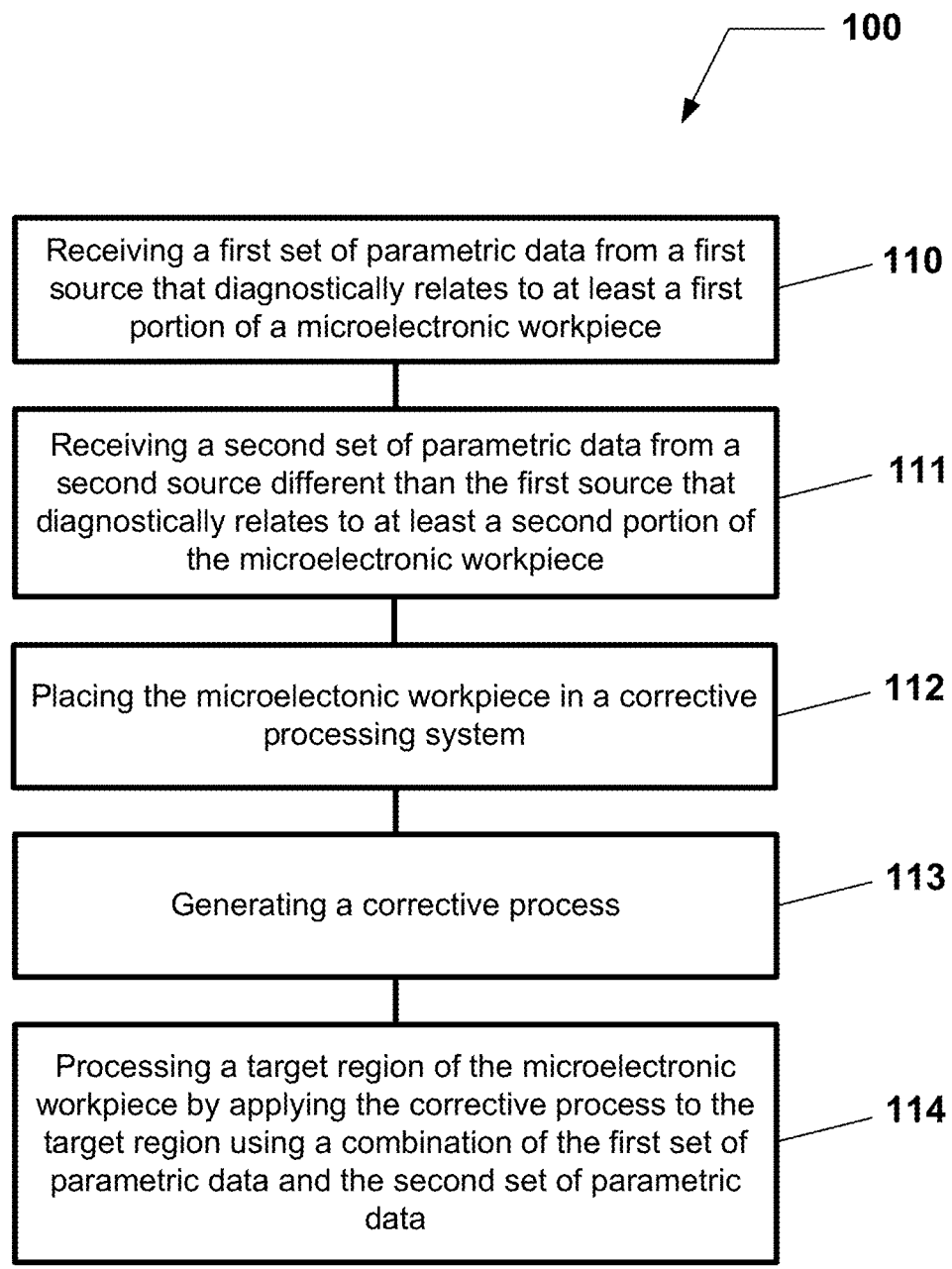
FIG. 1 is a flow chart illustrating a method for processing a workpiece according to an embodiment.
Figure 2A:
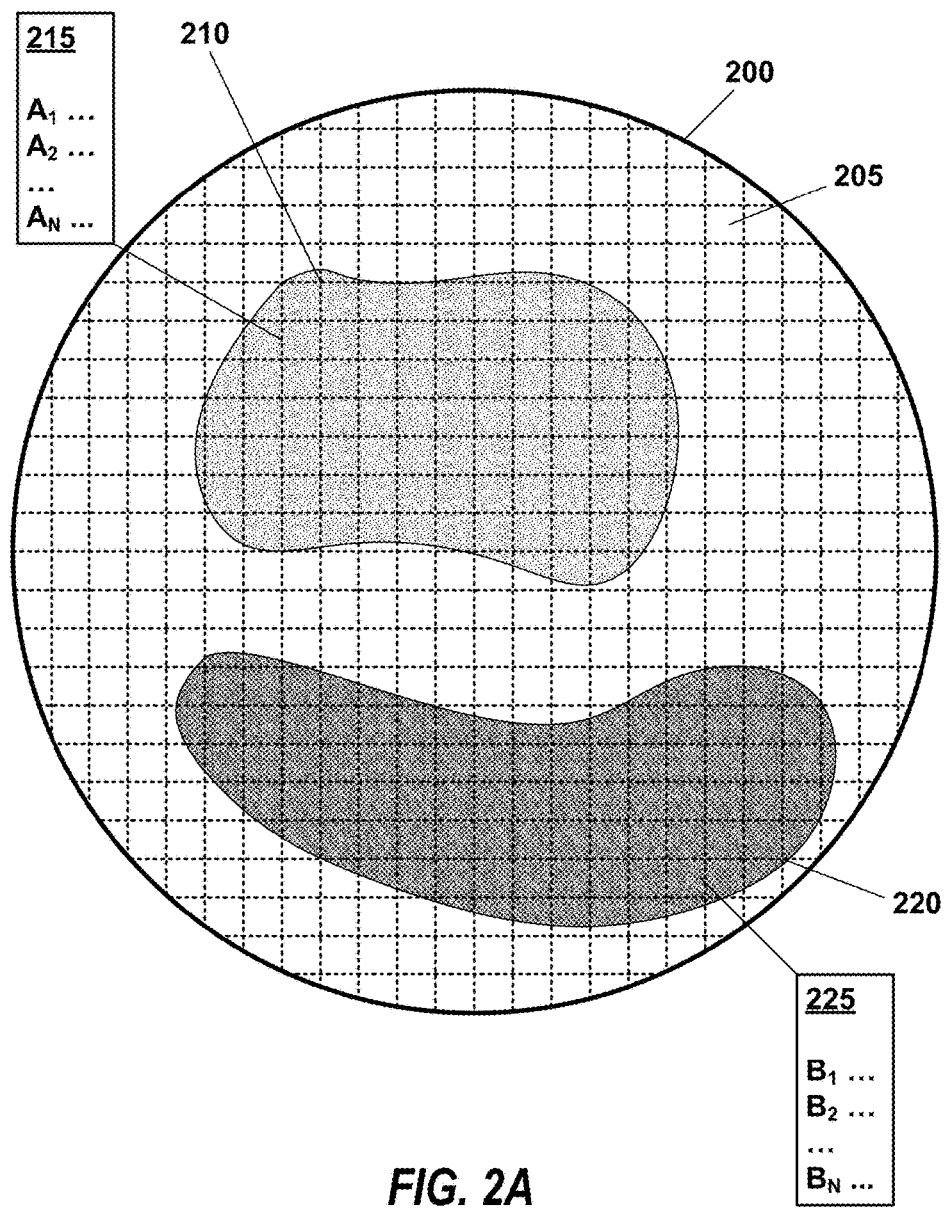
FIGS. 2A through 2C illustrate different parametric data regions on a workpiece to be processed according to an embodiment.

To improve corrective capability, methods and systems for performing corrective processing of a workpiece with enhanced corrective capability are described according to various embodiments. Referring now to the drawings wherein like reference numerals designate corresponding parts throughout the several views, FIG. 1 provides a flow chart 100 illustrating a method for performing corrective processing of a workpiece according to an embodiment, and FIG. 2A provides an illustration of a workpiece surface to be processed.

The method illustrated in flow chart 100 begins in 110 with receiving a first set of parametric data from a first source 215 that diagnostically relates to at least a first portion 210 of a microelectronic workpiece 200 having, for example, multiple die 205. The microelectronic workpiece 200 can, for example, include a semiconductor substrate, or a flat panel display or device.

Figure 2B:
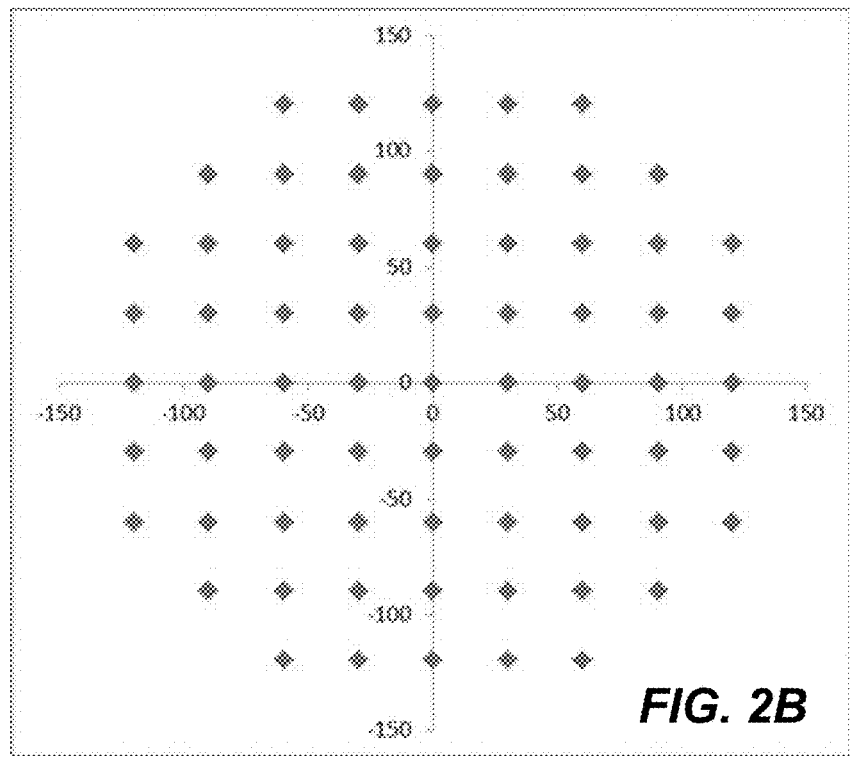
Figure 2C:
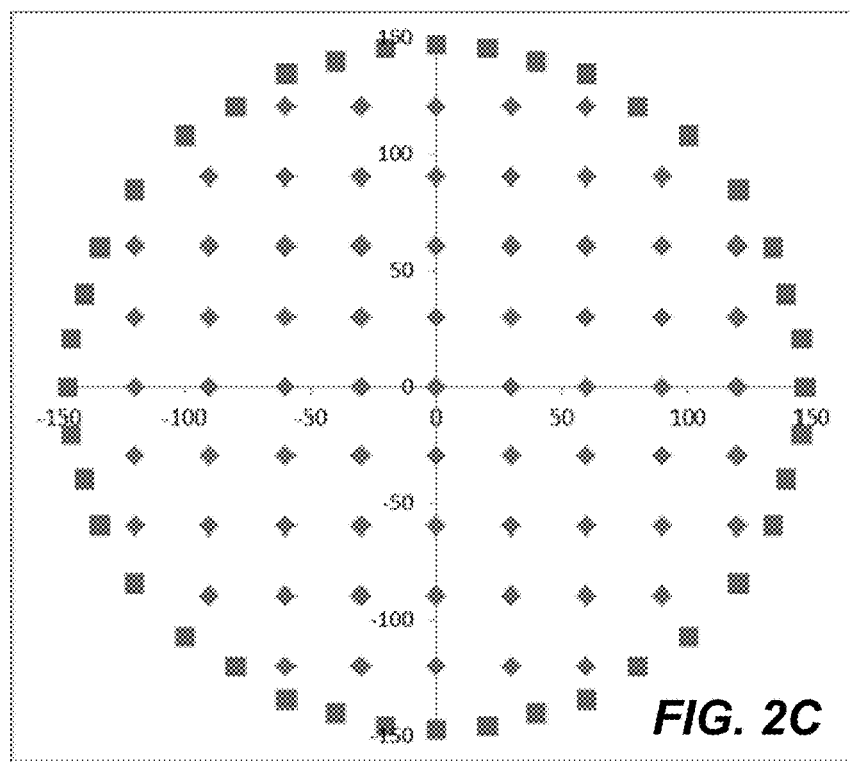

In 111, a second set of parametric data is received from a second source 225 different than the first source 215 that diagnostically relates to at least a second portion 220 of the microelectronic workpiece 200. In one embodiment, the first portion 210 of the microelectronic workpiece 200 includes a central region of the microelectronic workpiece 200, and the second portion 220 of the microelectronic workpiece 200 includes an edge region of the microelectronic workpiece 200. In another embodiment, the first set of parametric data includes data related to a workpiece attribute of the microelectronic workpiece 200 beyond a pre-determined distance from the workpiece edge (see FIG. 2B, data sites are identified as "diamonds"), and the second set of parametric data includes data related to a workpiece attribute of the microelectronic workpiece 200 within the pre-determined distance from the workpiece edge (see FIG. 2C, data sites are identified as "squares"). For example, the second set of parametric data includes data related to a workpiece attribute of the microelectronic workpiece 200 within 20% of the workpiece diameter from the workpiece edge, or within 10% of the workpiece diameter from the workpiece edge, or even within 5% of the workpiece diameter from the workpiece edge.

The first source 215, which includes the first set of parametric data, can provide data measured on the microelectronic workpiece 200 or another production microelectronic workpiece. For example, the first set of parametric data includes data from a patterned die measurement set. The first set of parametric data, including the measured attribute, may be acquired using a metrology system coupled to a corrective processing system, either in-situ or ex-situ. The metrology system may comprise any variety of workpiece diagnostic system including, but not limited to, geometrical, mechanical, optical, and/or electrical test/metrology systems. For example, the metrology system may include optical digital profilometry (ODP), scatterometry, ellipsometry, reflectometry, interferometry, X-ray fluorescence spectroscopy, scanning electron microscopy (SEM), tunneling electron microscopy (TEM), atomic force microscopy (AFM), or four-point probe sensing, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a workpiece.

The first set of parametric data may be measured at two or more locations on the microelectronic workpiece 200. Moreover, this data may be acquired and collected for one or more workpieces. The one or more workpieces may, for instance, include a cassette of workpieces. The first set of parametric data is measured at two or more locations on at least one of the one or more workpieces and may, for example, be acquired at a plurality of locations on each of the one or more workpieces. Thereafter, the plurality of locations on each of the plurality of workpieces can be expanded from measured sites to unmeasured sites using a data fitting algorithm. For example, the data fitting algorithm can include interpolation (linear or nonlinear) or extrapolation (linear or nonlinear) or a combination thereof.

Furthermore, the second source 225, which includes the second set of parametric data, can provide simulated data, empirically determined data, or data measured independent of the first set of parametric data. For example, the simulated data can include computer model generated data. Additionally, for example, the empirically determined data can include data generated or assembled from past experience, experiments, observations, measurements, or simulations. The second set of parametric data can include interpolated or extrapolated data from a data source other than the first set of parametric data. The inventors have observed that the interpolation or extrapolation of the first set of parametric data is inaccurate in predicting the behavior or attributes of the second portion 220 of the microelectronic workpiece 200.

The first and second set of parametric data can include geometrical, mechanical, electrical, and/or optical parameters associated with the microelectronic workpiece 200, any layer or sub-layer formed on the microelectronic workpiece 200, and/or any portion of a device on the microelectronic workpiece 200. For example, the measured attribute can include a film thickness, a surface and/or interfacial roughness, a surface contamination, a feature depth, a trench depth, a via depth, a feature width, a trench width, a via width, a critical dimension (CD), a surface roughness, or an electrical resistance, or any combination of two or more thereof.

Thereafter, in 112, the microelectonic workpiece 200 is placed in a corrective processing system. In 113, a corrective process is generated, and in 114, a target region of the microelectronic workpiece 200 is processed by applying the corrective process to the target region using a combination of the first set of parametric data and the second set of parametric data. The target region of the microelectronic workpiece 200 can include the entire exposed surface of the microelectronic workpiece 200, or a portion of the exposed surface of the microelectronic workpiece 200.

In various embodiments, the corrective processing system is a beam processing system and the corrective process includes generating a processing beam, wherein applying the corrective process includes irradiating the processing beam along a beam scan pattern onto the target region. The processing can include scanning the microelectronic workpiece 200 through the processing beam, or scanning the processing beam across the microelectronic workpiece 200. Furthermore, the processing beam can include a neutral beam, a charged particle beam, a gas cluster beam (GCB), or a gas cluster ion beam (GCIB), or any portion thereof, or any combination thereof.

In alternative embodiments, the corrective processing system is a non-beam processing system. For example, the corrective processing system is an etching system and the corrective process includes generating a gas-phase processing environment, wherein applying the corrective process includes immersing the microelectronic workpiece 200 within and exposing the target region to the gas-phase processing environment. Additionally, for example, the etching system is a plasma etching system.

Using the corrective processing system, an applied property of the corrective process can be spatially modulated, based at least in part on the parametric data, as a function of position on the microelectronic workpiece 200 to achieve a target profile of a workpiece attribute. The corrective process can include an etch process, a deposition process, a growth process, a smoothing process, a doping process, a modification process, or any combination of two or more thereof to achieve a target profile of a workpiece attribute of the microelectronic workpiece 200.

Once the first and second sets of parametric data are retrieved and combined to create a superset of parametric data, the superset of parametric data is provided to a controller for computing correction data and generating the corrective process. The superset of parametric data may be communicated between the metrology system and the controller via a physical connection (e.g., a cable), or a wireless connection, or a combination thereof. Additionally, the parametric data may be communicated via an intranet or Internet connection. Alternatively, the superset of parametric data may be communicated between the metrology system and the controller via a computer readable medium.

Correction data is computed for corrective processing of the workpiece. More specifically, the correction data may be computed using the initial profile and the target profile for the measured attribute. The correction data for a given workpiece can comprise a process condition for modulation of a corrective processing system property, such as the dose or process parameter (e.g., temperature), as a function of position on the workpiece in order to achieve a change between the parametric data associated with the incoming initial profile and the target profile for the given workpiece. For example, the correction data for a given workpiece can comprise determining a process condition for using the corrective processing system to correct a non-uniformity of the parametric data for the given workpiece. Alternatively, for example, the correction data for a given workpiece can comprise determining a process condition for using the corrective processing system to create a specifically intended non-uniformity of the parametric data for the given workpiece.

Figure 3:
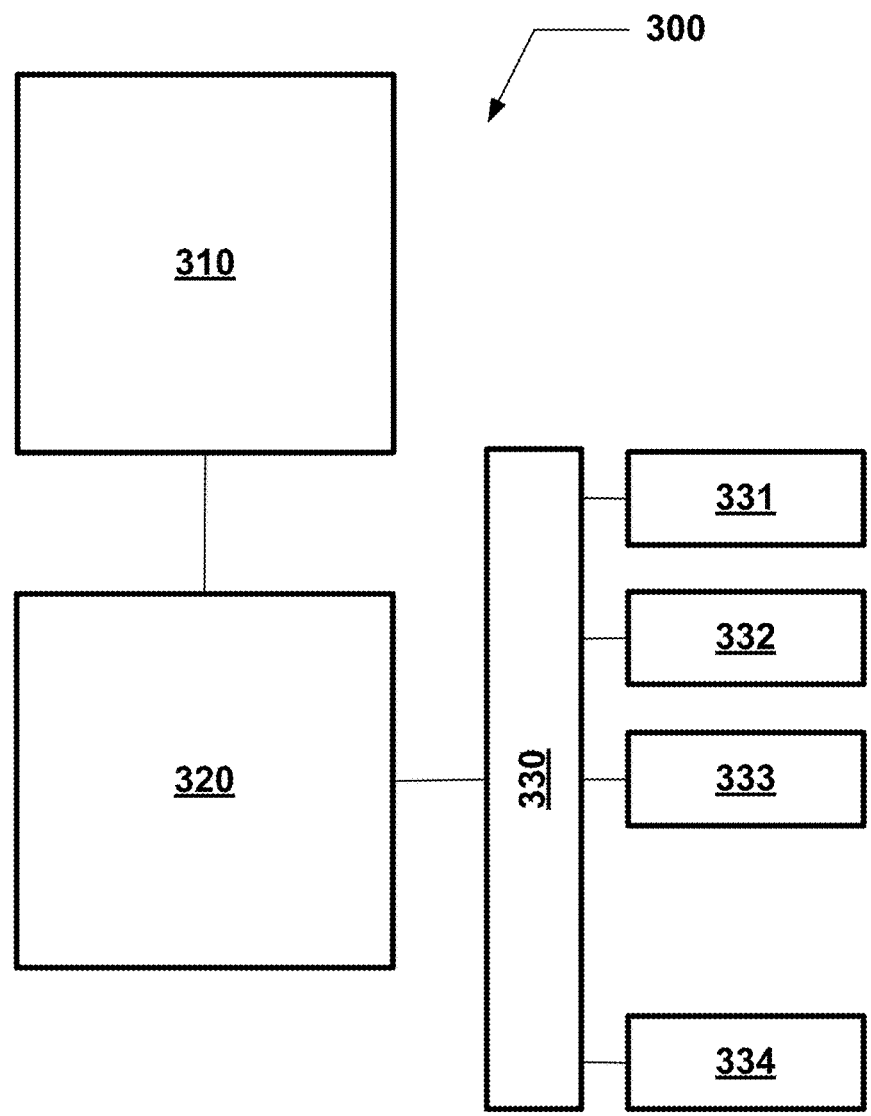
FIG. 3 provides an illustration of a corrective processing system according to an embodiment.

Turning now to FIG. 3, a processing system 300 configured to perform corrective processing on a microelectronic workpiece is described according to various embodiments. The processing system 300 includes a corrective processing system 310 configured to treat a microelectronic workpiece with a corrective process, and a multi-process controller 320 having a data interface 330 programmably configured to: receive a first set of parametric data from a first source 331 that diagnostically relates to at least a first portion of a microelectronic workpiece, receive a second set of parametric data from a second source 332 different than the first source 331 that diagnostically relates to at least a second portion of the microelectronic workpiece, generate a corrective process; and process a target region of the microelectronic workpiece by applying the corrective process to the target region using a combination of the first set of parametric data and the second set of parametric data. The multi-process controller 320 may also interface with additional data sources 333, 334.

Processing system 300 can include a spatial modulation system configured to spatially modulate an applied property of the corrective process, based at least in part on the first and second sets of parametric data, as a function of position on the microelectronic workpiece to achieve a target profile of a workpiece attribute. Furthermore, processing system 300 can include a metrology system configured to collect at least the first set of parametric data for one or more microelectronic workpieces.

Figure 4:
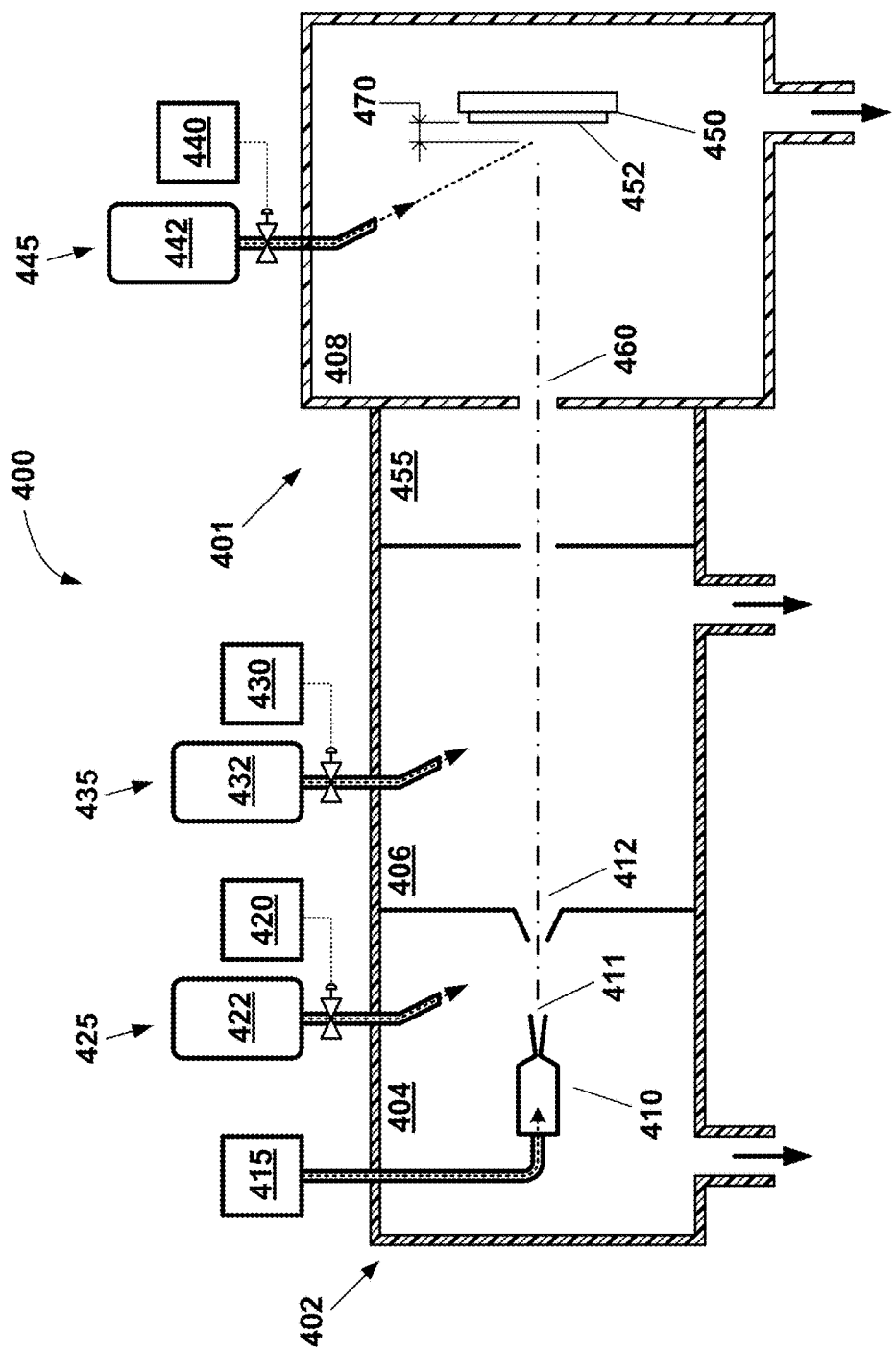
FIG. 4 provides an illustration of a beam processing system according to an embodiment.

According to one embodiment, the corrective processing system 310 includes a beam processing system. As shown in FIG. 4, a gas cluster ion beam (GCIB) processing system 400 is described according to an embodiment. In particular, GCIB processing system 400 includes a GCIB source 401 having a nozzle assembly 410 that is configured to introduce a primary gas through the nozzle assembly 410 to a vacuum vessel 402 in order to produce a gas cluster beam. An ionizer 412 is positioned downstream from the nozzle assembly 410, and configured to ionize the gas cluster beam to produce a GCIB.

The GCIB processing system 400 further includes a workpiece holder 450, upon which a workpiece 452 to be processed is affixed and scanned within vacuum vessel 402. Vacuum vessel 402 comprises three communicating chambers, namely, a source chamber 404, an ionization/acceleration chamber 406, and a processing chamber 408 to provide a reduced-pressure enclosure. The three chambers are evacuated to suitable operating pressures by one or more vacuum pumping systems. In the three communicating chambers 404, 406, 408, a gas cluster beam can be formed in the first chamber (source chamber 404), while a GCIB can be formed in the second chamber (ionization/acceleration chamber 406) wherein the gas cluster beam is ionized and accelerated. Then, in the third chamber (processing chamber 408), the accelerated GCIB may be utilized to treat workpiece 452. The vacuum vessel 402 may also include a pressure cell chamber 455. The pressure cell chamber 455 is coupled to an inert gas supply system (not shown in FIG. 4) that supplies a background gas to the pressure cell chamber 455 for elevating the pressure in the pressure cell chamber 455.

The GCIB processing system 400 can further include a secondary gas source (425, 435, 445), wherein the secondary gas source (425, 435, 445) includes a secondary gas supply system (422, 432, 442) that delivers a secondary gas, and a secondary gas controller (420, 430, 440) that operatively controls the flow of the secondary gas injected into the GCIB processing system 400 downstream of the nozzle assembly 410. In one embodiment, the secondary gas source 425 is arranged to deliver the secondary gas into the source chamber 404 downstream of the exit 411 of the nozzle assembly 410. In another embodiment, the secondary gas source 435 is arranged to deliver the secondary gas into the ionization/acceleration chamber 406 downstream of a skimmer 412. In another embodiment, the secondary gas source 445 is arranged to deliver the secondary gas into the processing chamber 408 downstream of a final aperture 460. In another embodiment, any combination of the secondary gas source (425, 435, 445) may be used.

In another embodiment, the secondary gas source 445 is arranged to deliver the secondary gas into the processing chamber 408 downstream of the final aperture 460 and along a path that intersects the GCIB at a location spaced away from the exposed surface of workpiece 452 by a separation distance 470 (for example, the secondary gas is directed to the processing chamber 408 at or near an impact region of the GCIB with the substrate). Separation distance 470 may be a distance less than 10 mm, less than 5 mm, less than 2 mm, or substantially nil (the secondary gas may be a jet or beam that intersects the GCIB at the exposed surface of the substrate).

The secondary gas controller (420, 430, 440) may be coupled to one or more flow control valves, flow sensors, or pressure sensors. And, the secondary gas controller (420, 430, 440) can control a pressure (e.g., total/stagnation pressure) at which the secondary gas is injected, or a flow rate of the secondary gas, or combination thereof.

Additional details concerning the design of a gas cluster ion beam system are provided in U.S. Patent Application Publication No. 2010/0193701A1, entitled "Multiple Nozzle Gas Cluster Ion Beam System" and filed on Apr. 23, 2009; and U.S. Patent Application Publication No. 2010/0193472A1, entitled "Multiple Nozzle Gas Cluster Ion Beam Processing System and Method of Operating" and filed on Mar. 26, 2010; the contents of which are herein incorporated by reference in their entirety.

Figure 5A:
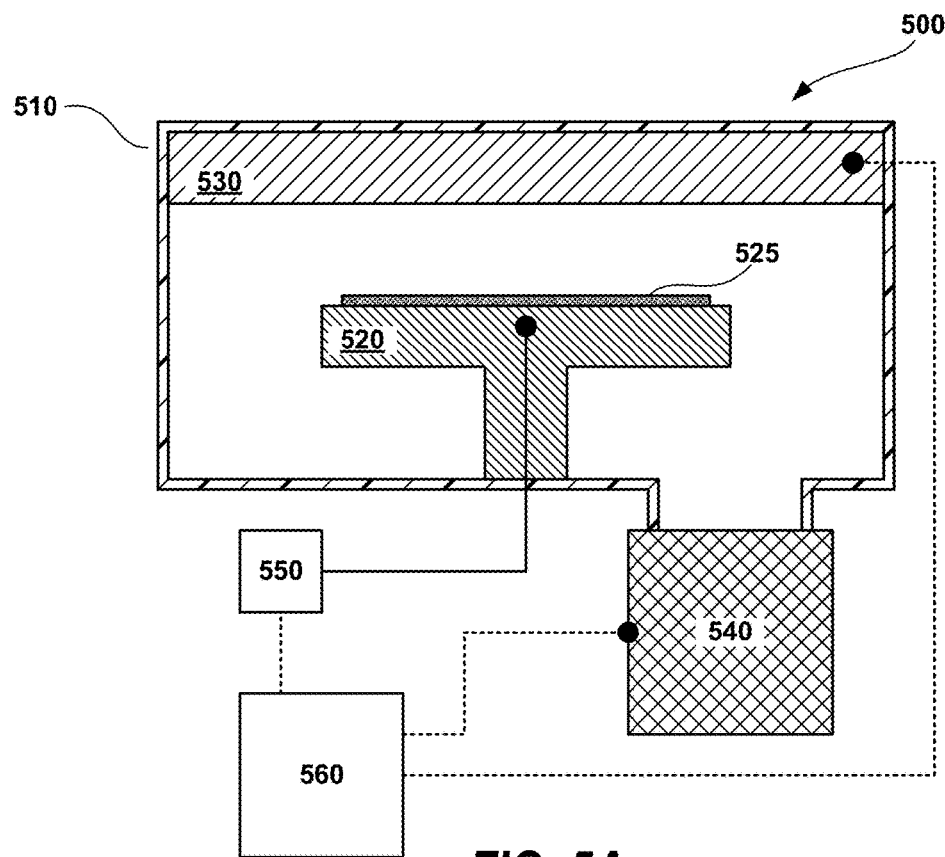
FIGS. 5A and 5B provide an illustration of a non-beam processing system according to another embodiment.
Figure 5B:
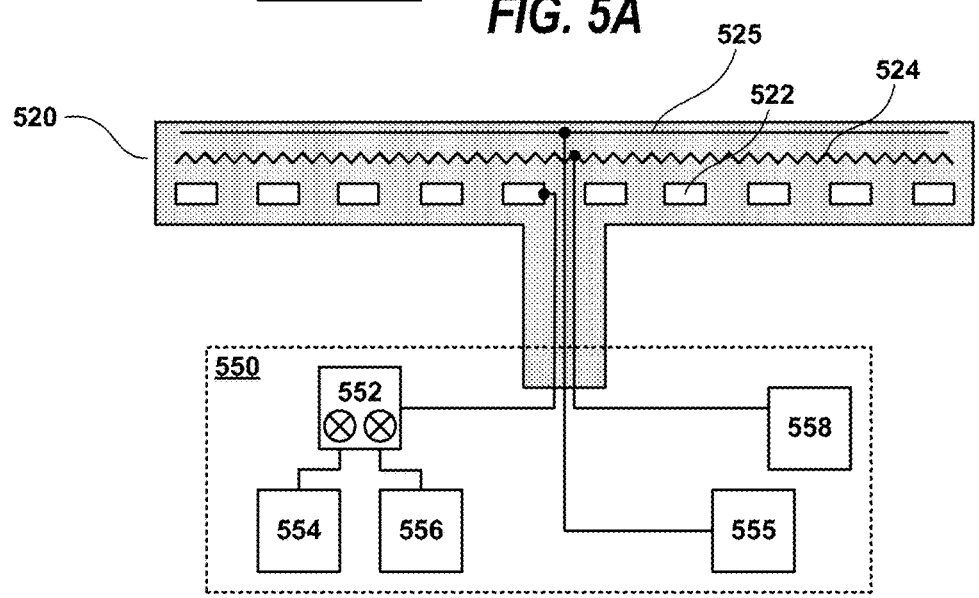

According to another embodiment, the corrective processing system 310 includes a non-beam processing system. As shown in FIGS. 5A and 5B, a corrective processing system 500 for gas-phase treatment of a microelectronic workpiece 525 is shown. The system 500 includes a process chamber 510 for processing workpiece 525 in a non-plasma or plasma vacuum environment, a workpiece holder 520 arranged within the process chamber 510, and configured to support the workpiece 525, a temperature control system 550 coupled to the workpiece holder 520, and configured to control the temperature of the workpiece holder 520 at one or more setpoint temperatures, a gas distribution system 530 coupled to the process chamber 510, and arranged to supply one or more process gases into the process chamber 510, and a controller 560 operably coupled to the temperature control system 550, and configured to control the temperature of the workpiece holder 520.

While not shown, process chamber 510 can include one or more electrodes to which radio frequency (RF) power is coupled for generating and manipulating plasma. As an example, gas distribution system 530 can be embedded within an upper electrode, and the workpiece holder 520 can further serve as a bias electrode. Other power coupling elements are also contemplated, including inductively coupled antenna and microwave frequency powered antenna.

The process chamber 510 can include a vacuum pump 540 to evacuate process gases from process chamber 510. The process chamber 510 can further include a remote plasma generator or remote radical generator arranged to supply the process chamber with excited, radical or metastable species, or combinations thereof.

Workpiece holder 520 can provide several operational functions for thermally controlling and processing workpiece 525. The workpiece holder 520 includes one or more temperature control elements configured to adjust and/or elevate a temperature of the workpiece 520.

As shown in FIG. 5B, workpiece holder 520 can include at least one fluid channel 522 to allow flow of a heat transfer fluid there through and alter a temperature of the workpiece holder 520. Workpiece holder 520 can further include at least one resistive heating element 524. Multi-zone channels and/or heating elements can be used to adjust and control the spatial uniformity of heating and cooling of workpiece 525. For example, the at least one resistive heating element 524 can include multiple heating elements zoned at die resolution or less.

A power source 558 is coupled to the at least one resistive heating element 524 to supply electrical current. The power source 558 can include a direct current (DC) power source or an alternating current (AC) power source. Furthermore, the at least one resistive heating element 524 can be connected in series or connected in parallel.

A heat transfer fluid distribution manifold 552 is arranged to pump and monitor the flow of heat transfer fluid through the one or more fluid channels 522. The heat transfer fluid distribution manifold 552 can draw heat transfer fluid from a first heat transfer fluid supply bath 554 at a first heat transfer fluid temperature and/or a second heat transfer fluid supply bath 556 at a second heat transfer fluid temperature. Manifold 552 can mix heat transfer fluid from the first and second fluid baths 554, 556 to achieve an intermediate temperature. Furthermore, the heat transfer fluid distribution manifold 552 can include a pump, a valve assembly, a heater, a cooler, and a fluid temperature sensor to controllably supply, distribute, and mix a heat transfer fluid at a predetermined temperature.

The workpiece holder 520 can further include a workpiece clamping system 550 configured to clamp the workpiece to the workpiece holder via clamp electrode 525, and a backside gas supply system configured to supply a heat transfer gas to the backside of the workpiece.

Workpiece holder 520 can be monitored using one or more temperature sensing devices. Furthermore, the substrate holder temperature control system 550 may utilize the temperature measurement as feedback to the workpiece holder 520 in order to control the temperature of workpiece holder 520. For example, at least one of a fluid flow rate, a fluid temperature, a heat transfer gas type, a heat transfer gas pressure, a clamping force, a resistive heater element current or voltage, a thermoelectric device current or polarity, etc. may be adjusted in order to affect a change in the temperature of workpiece holder 520 and/or the temperature of the workpiece 525.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for performing corrective processing of a workpiece, the method comprising:
   receiving a first set of parametric data from a first source that diagnostically relates to at least a first portion of a microelectronic workpiece, wherein the first source is a metrology system;
   receiving a second set of parametric data from a second source different than the metrology system used as the first source that diagnostically relates to at least a second portion of the microelectronic workpiece;
   placing the microelectronic workpiece in a corrective processing system;
   generating a corrective process; and
   processing a target region of the microelectronic workpiece by applying the corrective process to the target region using a combination of the first set of parametric data and the second set of parametric data.

2. The method of claim 1, wherein the microelectronic workpiece includes a semiconductor substrate, or a flat panel display or device.

3. The method of claim 1, wherein the corrective processing system is a beam processing system and the corrective process includes generating a processing beam, and wherein applying the corrective process includes irradiating the processing beam along a beam scan pattern onto the target region.

4. The method of claim 3, wherein the processing includes:
   scanning the microelectronic workpiece through the processing beam; or
   scanning the processing beam across the microelectronic workpiece.

5. The method of claim 3, wherein the processing beam includes a neutral beam, a charged particle beam, a gas cluster beam (GCB), or a gas cluster ion beam (GCIB), or any portion thereof, or any combination thereof.

6. The method of claim 1, wherein the corrective processing system is an etching system and the corrective process includes generating a gas-phase processing environment, and wherein applying the corrective process includes immersing the microelectronic workpiece within and exposing the target region to the gas-phase processing environment.

7. The method of claim 6, wherein the etching system is a plasma etching system.

8. The method of claim 1, wherein the first portion of the microelectronic workpiece includes a central region of the microelectronic workpiece, and the second portion of the microelectronic workpiece includes an edge region of the microelectronic workpiece.

9. The method of claim 1, wherein the first set of parametric data includes data related to a workpiece attribute of the microelectronic workpiece beyond a pre-determined distance from the workpiece edge, and the second set of parametric data includes data related to a workpiece attribute of the microelectronic workpiece within the pre-determined distance from the workpiece edge.

10. The method of claim 1, wherein the first set of parametric data includes data measured on the microelectronic workpiece or another production microelectronic workpiece, and wherein the second set of parametric data includes simulated data, empirically determined data, or data measured independent of the first set of parametric data.

11. The method of claim 1, wherein the first set of parametric data includes data from a patterned die measurement set, and the second set of parametric data is combined with the first set of parametric data and is data from other than the patterned die measurement set.

12. The method of claim 1, further comprising:
   spatially modulating an applied property of the corrective process, based at least in part on the parametric data, as a function of position on the microelectronic workpiece to achieve a target profile of a workpiece attribute.

13. The method of claim 12, wherein the first set of parametric data, or the second set of parametric data, or both are workpiece attribute data including a film thickness, a surface roughness, a surface contamination, a feature depth, a trench depth, a via depth, a feature width, a trench width, a via width, a critical dimension (CD), a surface roughness, or an electrical resistance, or any combination of two or more thereof.

14. The method of claim 1, wherein the corrective process includes an etch process, a deposition process, a growth process, a smoothing process, a doping process, a modification process, or any combination of two or more thereof to achieve a target profile of a workpiece attribute of the microelectronic workpiece.

15. A method for performing corrective processing of a workpiece, the method comprising:
   receiving a first set of parametric data from a first source that diagnostically relates to a central region of a microelectronic workpiece that is beyond a pre-determined distance from the workpiece edge;
   receiving a second set of parametric data from a second source different than and independent of the first source that diagnostically relates to a peripheral region of the microelectronic workpiece that is within the pre-determined distance from the workpiece edge;
   combining the first and second sets of parametric data to create a superset of parametric data;
   placing the microelectronic workpiece in a corrective processing system;
   generating a corrective process using the superset of parametric data; and
   processing a target region of the microelectronic workpiece by applying the corrective process to the target region, wherein the first source is a metrology system and the first set of parametric data includes measurement data for an attribute measured by the metrology system at two or more locations in the central region of the microelectronic workpiece or another production microelectronic workpiece, and wherein the second source is a data source that is different than the metrology system used as the first source, and the second set of parametric data includes simulated data, empirically determined data, or measured data for the peripheral region of the microelectronic workpiece.

16. The method of claim 15, wherein the pre-determined distance from the workpiece edge is 20% of the workpiece diameter.

17. The method of claim 15, wherein the second source provides simulated data generated from a computer model for the peripheral region of the microelectronic workpiece.

18. The method of claim 15, wherein the second source provides empirical data generated or assembled from past experience, experiments, observations, measurements, or simulations for the peripheral region of the microelectronic workpiece.

19. The method of claim 15, wherein the second source provides measured data for the attribute in the peripheral region of the microelectronic workpiece, the method further comprising:

applying a first data fitting algorithm to the measurement data measured by the metrology system at the two or more locations in the central region of the microelectronic workpiece and interpolating and/or extrapolating the measurement data to unmeasured locations in the central region of the microelectronic workpiece to expand the first set of parametric data; and applying a second data fitting algorithm to the measured data from the second source and interpolating and/or extrapolating the measured data to unmeasured locations in the peripheral region of the microelectronic workpiece to expand the second set of parametric data, wherein the superset of parametric data is created from the expanded first and second sets of parametric data.

20. A method for performing corrective processing of a workpiece, the method comprising:

receiving a first set of parametric data from a first source that diagnostically relates to at least a first portion of a microelectronic workpiece;

receiving a second set of parametric data from a second source different than the first source that diagnostically relates to at least a second portion of the microelectronic workpiece;

placing the microelectronic workpiece in a corrective processing system;

generating a corrective process; and processing a target region of the microelectronic workpiece by applying the corrective process to the target region using a combination of the first set of parametric data and the second set of parametric data, wherein the first set of parametric data includes measurement data for an attribute measured at two or more locations in the first portion of the microelectronic workpiece or another production microelectronic workpiece, and wherein the second set of parametric data includes simulated data or empirically determined data for the second portion of the microelectronic workpiece.

* * * * *